United States Patent
Igarashi et al.

(10) Patent No.: US 8,309,277 B2
(45) Date of Patent: Nov. 13, 2012

(54) PHOTOMASK MAKING METHOD

(75) Inventors: Shinichi Igarashi, Joetsu (JP); Yukio Inazuki, Joetsu (JP); Hideo Kaneko, Joetsu (JP); Hiroki Yoshikawa, Joetsu (JP); Yoshinori Kinase, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 162 days.

(21) Appl. No.: 12/813,137

(22) Filed: Jun. 10, 2010

(65) Prior Publication Data

US 2010/0316942 A1 Dec. 16, 2010

(30) Foreign Application Priority Data

Jun. 11, 2009 (JP) ................................. 2009-140374

(51) Int. Cl.
*G03F 1/50* (2012.01)

(52) U.S. Cl. .......................................................... 430/5

(58) Field of Classification Search ............... 430/5, 322, 430/323; 216/58
See application file for complete search history.

(56) References Cited

U.S. PATENT DOCUMENTS

| | | | |
|---|---|---|---|
| 7,625,676 B2 | 12/2009 | Yoshikawa et al. | |
| 7,691,546 B2 | 4/2010 | Yoshikawa et al. | |
| 2003/0180631 A1* | 9/2003 | Shiota et al. | 430/5 |
| 2006/0057469 A1 | 3/2006 | Kureishi et al. | |
| 2007/0212618 A1 | 9/2007 | Yoshikawa et al. | |
| 2007/0212619 A1 | 9/2007 | Yoshikawa et al. | |

FOREIGN PATENT DOCUMENTS

| | | |
|---|---|---|
| CN | 101261440 A | 9/2008 |
| EP | 1650600 A2 | 4/2006 |
| EP | 1 801 647 A1 | 6/2007 |
| EP | 1 832 925 A2 | 9/2007 |
| EP | 1 832 926 A2 | 9/2007 |
| JP | 63-85553 A | 4/1988 |
| JP | 2001-27799 A | 1/2001 |
| JP | 2006-78807 A | 3/2006 |
| JP | 2006-146152 A | 6/2006 |
| JP | 2007-241060 A | 9/2007 |
| JP | 2007-241065 A | 9/2007 |
| JP | 2007-271774 A | 10/2007 |
| WO | 2008/139904 A1 | 11/2008 |

OTHER PUBLICATIONS

European Search Report dated Sep. 13, 2012, issued in corresponding European Application No. 10251082.3.
Japanese Office Action dated Sep. 26, 2012, issued in corresponding Japanese Applicatio No. 2009-140374.

* cited by examiner

*Primary Examiner* — Stephen Rosasco
(74) *Attorney, Agent, or Firm* — Birch Stewart Kolasch & Birch, LLP

(57) ABSTRACT

A photomask is manufactured from a photomask blank comprising a transparent substrate and a light-shielding film consisting of upper and lower layers of transition metal-containing silicon base materials, the content of O+N in the upper layer being higher than that of the lower layer. The light-shielding film is processed in two steps by fluorine dry etching through a resist pattern such that a lower portion of the film is left behind, and oxygen-containing chlorine dry etching for removing the remainder of the film.

19 Claims, 3 Drawing Sheets

PHOTOMASK MAKING METHOD

CROSS-REFERENCE TO RELATED APPLICATION

This non-provisional application claims priority under 35 U.S.C. §119(a) on Patent Application No. 2009-140374 filed in Japan on Jun. 11, 2009, the entire contents of which are hereby incorporated by reference.

TECHNICAL FIELD

This invention relates to a method for manufacturing photomasks for use in the microfabrication of semiconductor integrated circuits, charge coupled devices (CCD), liquid crystal display (LCD) color filters, magnetic heads or the like.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shield pattern. In an attempt to miniaturize the light-shield pattern, if processing is carried out while maintaining the thickness of the resist film at the same level as in the art prior to the miniaturization, the ratio of film thickness to pattern width, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film material, chromium base materials were used in the prior art. It is described in Patent Document 1 that silicon base materials such as materials containing silicon or materials containing silicon and a transition metal have good light-shielding properties to exposure light with a wavelength up to 200 nm, are susceptible to fluorine dry etching which will cause minimal damage to the resist pattern, and can thus be processed at a higher accuracy. Higher accuracy processing becomes possible when these materials are combined with the etching technique using a hard mask of chromium base material (see Patent Document 2). Thus, films formed of silicon base materials are considered promising as the light-shielding film of the next generation.

CITATION LIST

Patent Document 1: JP-A 2007-241065
  (US 2007212618, EP 1832925, CN 101261440)
Patent Document 2: JP-A 2007-241060
  (US 2007212619, EP 1832926)
Patent Document 3: JP-A 2006-146152
Patent Document 4: JP-A S63-85553
Patent Document 5: JP-A 2001-027799
Patent Document 6: JP-A 2006-078807
  (U.S. Pat. No. 7,691,546, EP 1801647)

SUMMARY OF INVENTION

When the requirements of further miniaturization and higher accuracy are imposed on photomasks, the resist film used in mask processing is required to have higher etch resistance in order to gain a higher resolution and better transfer performance. The resist film must also be reduced in thickness for the above-described reason. On the other hand, pattern processing of a light-shielding film of silicon base material using an etch mask of chromium base material must employ, for etching, oxygen-containing chlorine base gas which gives a substantial load to the resist film. If a further reduction of resist film thickness and a higher accuracy than the state-of-the-art are required, the accuracy improvement can reach the limit.

An object of the invention is to provide a method for processing a photomask blank having a light-shielding film composed mainly of a transition metal-containing silicon base material layer having better optical properties and a high accuracy processing ability into a photomask at a higher accuracy, the method being capable of precise processing even when a thinner resist film is used.

The light-shielding film materials for photomasks proposed thus far include metal or metal compound materials, for example, transition metals such as chromium and tantalum, and transition metal compounds containing light elements such as oxygen, nitrogen and carbon, and silicon base materials, for example, silicon or metal silicon compounds, and silicon compounds containing light elements such as oxygen, nitrogen and carbon. Typical methods for dry etching films of these materials include fluorine dry etching using a fluorine-containing compound gas and chlorine dry etching using chlorine or chlorine-containing compound gas.

Of these methods, the fluorine dry etching method is often used in the dry etching of metal materials such as tantalum and tungsten and silicon base materials such as silicon compounds and transition metal-containing silicon compounds since it advantageously applies no load to ordinary organic resists.

When the hard mask technique as described in Patent Document 2 is introduced, it is believed suitable for processing with a thinner resist film that the hard mask is made of a material which can be processed by fluorine dry etching, and the light-shielding film is made of a material which can be processed by oxygen-containing chlorine dry etching. However, when a chromium base film which is a typical material to be processed using a hard mask of silicon base compound is used as the main layer of the light-shielding film, the chromium base film undergoes side etching whereby the pattern as processed is reduced in dimensional accuracy, as demonstrated in Patent Document 3.

On the other hand, Patent Document 4 discloses that silicon oxide ($Si_mO_n$) can be used as a hard mask when a molybdenum silicide light-shielding film is processed. For the purpose of industrial manufacture, silicon oxide is difficult to apply to the manufacture of photomasks having a fine structure enough for use in the lithography of forming a pattern with a minimum line width of less than 50 nm because silicon oxide is likely to generate fine foreign particles upon deposition by sputtering.

Studying the possibility of selective etching of transition metal-containing silicon base materials in order to attain the above and other objects, the inventors have found that when two transition metal-containing silicon base materials (or silicon compound materials) differ in the content of oxygen and nitrogen, the material having a lower total content of oxygen and nitrogen can be selectively etched by using oxygen-containing chlorine dry etchant gas and adjusting the amount of oxygen in the etchant gas.

Making a further study in order to apply the selective etching method to the hard mask technique, the inventors have found the following. The light-shielding film is constructed as a stack of upper and lower layers of transition metal-containing silicon base materials having different contents of oxygen and nitrogen. A portion of the light-shielding film including at least the entirety of the upper layer having a higher total content of oxygen and nitrogen is processed by fluorine dry etching. Thereafter the remaining portion of the light-shielding film is etched with oxygen-containing chlorine base dry etchant gas, using as a hard mask a portion of the light-shielding film which is left behind after the processing. Then high-accuracy processing with minimal concomitant defects is possible. The light-shielding film can be processed at a high accuracy even if a resist film having a thickness of up to 150 nm, especially up to 100 nm is used.

The invention provides a method for manufacturing a photomask from a photomask blank comprising a transparent substrate and a light-shielding film disposed thereon, the light-shielding film consisting of upper and lower layers made of transition metal-containing silicon base materials, at least the upper layer containing oxygen and/or nitrogen, the total content of oxygen and nitrogen in the upper layer being higher than that of the lower layer. The method comprises a first stage etching step of dry etching the light-shielding film with fluorine base etchant gas using a resist pattern formed on the light-shielding film as an etch mask, for removing only the entirety of the upper layer or the entirety of the upper layer and a portion of the lower layer disposed remote from the transparent substrate such that at least a portion of the lower layer disposed adjacent to the transparent substrate is left behind; and a second stage etching step of dry etching the light-shielding film with oxygen-containing chlorine base etchant gas for removing the remainder of the light-shielding film which has not been removed by the first stage etching step, thereby processing the light-shielding film into the desired pattern.

In a preferred embodiment, the upper and lower layers have been deposited by sputtering while controlling a reactive gas or gases during deposition such that the upper layer may have a higher total content of oxygen and nitrogen than the lower layer. In another preferred embodiment, the upper and lower layers have been formed by oxidative treatment of a surface-adjoining portion of the light-shielding film such that the treated portion may have a higher total content of oxygen and nitrogen than the remaining portion, the treated and remaining portions becoming the upper and lower layers, respectively.

In a preferred embodiment, the photomask blank meets that provided that the material of the upper layer has a total content $C_1$ (mol %) of nitrogen and oxygen and the material of the lower layer has a total content $C_2$ (mol %) of nitrogen and oxygen, the difference between these total contents ($C_1$-$C_2$) is at least 5, and the second stage etching step includes dry etching with oxygen-containing chlorine base etchant gas in a molar ratio of oxygen to chlorine between 0.001 and 1.

In a preferred embodiment, the transition metal-containing silicon base material is a material containing a transition metal, silicon, and oxygen and/or nitrogen, or a material containing a transition metal and silicon and free of oxygen and nitrogen.

Typically the transition metal is titanium, vanadium, cobalt, nickel, zirconium, niobium, molybdenum, hafnium, tantalum, tungsten or a combination comprising at least one of the foregoing.

ADVANTAGEOUS EFFECTS OF INVENTION

In the photomask manufacturing method of the invention, the upper layer functions as an etch mask layer. Unlike a silicon oxide layer, the etch mask layer of a transition metal-containing silicon base material can be deposited as a least defective film. The method is suited for the manufacture of a photomask having a fine pattern with a minimum line width of up to 50 nm.

The inventive method eliminates a need for a chromium base material which must be processed under oxygen-containing chlorine base dry etching conditions which normally cause damages to a resist film. The dry etching technique using an etch mask is applicable to a light-shielding film having transition metal-containing silicon base material layers.

Even if the resist film used herein has a thickness of up to 150 nm, especially up to 100 nm, a photomask blank can be processed at a high accuracy into a photomask for use in lithography for forming a resist pattern with a minimum line width of up to 50 nm, because the upper layer whose remainder will later function as an etch mask can be processed by fluorine base dry etching.

DESCRIPTION OF EMBODIMENTS

A photomask is manufactured by processing a photomask blank, specifically a light-shielding film deposited on a transparent substrate. To this end, a resist pattern made of an organic film having a relatively high carbon content like an aromatic structure-containing resin is formed on the light-shielding film. Using the resist pattern as an etch mask, the light-shielding film of inorganic material is etched. Anisotropic dry etching is employed in order to form a light-shielding section in a pattern having the currently required fine size.

The photomasks used in micropatterning by photolithography as in the manufacture of semiconductor devices or the like are required to have a light-shielding pattern having a finer size and higher accuracy. A resist film is used to form a light-shielding pattern having a finer size. On account of the aspect ratio and other problems discussed above, a finer resist film is used as the pattern size becomes finer. The resist pattern is preferred to have side walls of higher perpendicularity. On dry etching, whether it is chlorine or fluorine base dry etching, pattern features are gradually abraded from edges so that the pattern features are regressed. In consequence, as the resist film used becomes thinner, more dimensional errors are found between the resist pattern and the processed light-shielding film.

One known method uses a hard mask for controlling the dimensional error due to regression of the resist pattern during dry etching. The method using a hard mask involves once transferring a resist pattern to a thin film having sufficient etch resistance under dry etching conditions of a relevant (processable) film and etching the relevant film using the resultant hard mask pattern as an etch mask. Since it is only required that the resist pattern be transferred to the thin hard mask film at a high accuracy, this method considerably reduces the load on the resist pattern during etching as compared with the case where the entire light-shielding film is etched through a resist pattern. The method using a hard mask is also applied to mask processing as disclosed in Patent Documents 2 and 4.

A focus is put on a transition metal-containing silicon base material since it is a light-shielding film material which can be precisely processed and offers appropriate optical properties. However, a problem arises when a chromium base material is used as the hard mask in order to process a light-shielding film of this material as described in Patent Document 2. Etching of the chromium base material uses oxygen-containing chlorine base dry etchant gas having a potential to damage the resist film. In the case where a thinner resist film is used, the resist pattern can be damaged by the chlorine dry etching, resulting in a dimensional accuracy being reduced by such damage. As a consequence, it is desired to have a transition metal-containing silicon base material as the hard mask material different from silicon oxide which tends to form unwanted defects during deposition as described in Patent Document 4, more specifically as a light-shielding film material which may be effectively deposited and processed under etching conditions causing least damages to the resist.

In conjunction with the dry etching techniques used in the prior art, etching selectivity is generally considered as follows.

(1) Chromium compounds provide an effective etching rate upon chlorine base dry etching, but have high resistance to fluorine base dry etching.

(2) Tantalum compounds provide an effective etching rate upon oxygen-free chlorine base dry etching and fluorine base dry etching, but have high resistance to oxygen-containing chlorine base dry etching.

(3) Silicon compounds and transition metal silicide compounds provide an effective etching rate upon fluorine base dry etching, but have high resistance to oxygen-containing chlorine base dry etching.

On the other hand, Patent Document 5 relates to processing of a half tone phase shift film and discloses that a MoSiON film, whose exact composition is unknown, can be etched under oxygen-containing chlorine base dry etching conditions over a considerably wide oxygen content range. These results evidence that a layer of a silicon base material containing a transition metal and oxygen and/or nitrogen can be etched under oxygen-containing chlorine dry etching conditions, while it is expected difficult to establish etching selectivity between silicon base materials containing a transition metal and oxygen and/or nitrogen. It is thus believed difficult to apply oxygen-containing chlorine dry etching to a silicon base material containing a transition metal and oxygen and/or nitrogen, which is later utilized in the hard mask technique.

To review the etching selectivity that is roughly acknowledged in the prior art, the inventors prepared many test samples and examined a selectivity ratio under various etching conditions and compositional changes. Against the expectation from the results shown in Patent Document 5, the inventors have found that by properly selecting the content of oxygen and nitrogen in a transition metal-containing silicon base material and properly controlling the amount of oxygen added to chlorine base dry etchant gas as will be described later, selective etching becomes possible between transition metal-containing silicon base materials having different contents of oxygen and/or nitrogen.

Application of this etching selectivity to the hard mask technique leads to the invention. A light-shielding film of multilayer structure consisting of transition metal-containing silicon base material layers of different composition ("multilayer structure" being inclusive of a layer wherein the concentration of a certain component varies in depth direction thereof) is formed, provided that a surface-adjoining layer (upper layer) is a transition metal-containing silicon base material layer having a higher total content of oxygen and nitrogen. First only the upper layer is processed by fluorine base dry etching. Thereafter, using the resultant upper layer pattern as a hard mask, a substrate-adjoining layer (lower layer) which is a transition metal-containing silicon base material layer having a lower total content of oxygen and nitrogen can be processed by etching with chlorine base dry etchant gas having an appropriate oxygen concentration.

Patent Document 6 discloses that the light-shielding film is constructed from an upper layer of a chromium base material and a lower layer of a silicon base material. By virtue of the difference in etching properties between them as described above, the lower layer is processed using the upper layer of chromium base material as a hard mask. High-accuracy mask processing is allegedly possible with a resist film having a thickness of about 250 nm. To the lower layer of this light-shielding film as well, the idea of selective etching between transition metal-containing silicon base materials according to the invention is applicable. If this lower layer consists of upper and lower sub-layers, the upper sub-layer can be processed by fluorine base dry etching causing least damage to the resist film, facilitating higher accuracy processing.

The photomask blank used in the manufacture of a photomask according to the invention comprises a light-shielding film which may be formed on a transparent substrate such as a quartz substrate directly or via another film. The blank may have a light-shielding film deposited directly on a transparent substrate for use as a binary mask or a light-shielding film deposited on a halftone phase shift film for use as a halftone phase shift mask. The photomask blank may further comprise an antireflective film, an etching stop film or the like. With respect to the optical properties of the light-shielding film, the light-shielding film in its entirety preferably has an optical density of 2 to 4, more preferably 2.5 to 4, relative to exposure light on use of the photomask when the photomask is a binary mask. When the light-shielding film is used on a halftone phase shift film, the light-shielding film combined with the halftone phase shift film preferably has an optical density of 2 to 4, more preferably 2.5 to 4.

The light-shielding film in the photomask blank used in the manufacture of a photomask according to the invention consists essentially of an upper layer and a lower layer. Each of upper and lower layers may have a single layer or multilayer structure. A composition transition region may intervene between the upper and lower layers. Both the layers are made of transition metal-containing silicon base materials. At least the upper layer material should contain oxygen and/or nitrogen while the lower layer material may contain oxygen and/or nitrogen or may not contain oxygen and nitrogen. The total content of oxygen and nitrogen must differ between the upper and lower layer materials in order to establish etching selectivity therebetween during oxygen-containing chlorine base dry etching. Provided that the upper layer material has a total content $C_1$ (mol %) of nitrogen and oxygen and the lower layer material has a total content $C_2$ (mol %) of nitrogen and oxygen, the difference between these total contents ($C_1$-$C_2$) is preferably at least 5, more preferably at least 10, and even more preferably at least 20. The upper layer having a higher total content of oxygen and nitrogen than the lower layer may function as a layer having an antireflective function or a layer sharing part of antireflective function within the light-shielding film.

For use as a binary mask in the ArF excimer laser lithography, the light-shielding film may have a thickness of about 30 to 100 nm. The thickness of the upper layer preferably ranges from 0.5 nm, more preferably from 1.0 nm as the lower limit, to 20 nm, more preferably to 10 nm, even more preferably to 5 nm as the upper limit, although the upper and lower limits vary depending on a choice of upper and lower layer materials. Within the range, precise processing is possible.

The transition metal contained in the light-shielding film is preferably selected from among titanium, vanadium, cobalt, nickel, zirconium, niobium, molybdenum, hafnium, tantalum, and tungsten, and mixtures of two or more of the foregoing. Inter alia, molybdenum is preferred from the standpoint of dry etching. The transition metal may be contained in such a content as to facilitate film formation, that is, to ensure that a film is deposited by sputtering, without generating particles which are unacceptable in the mask for forming a pattern of up to 50 nm size by lithography. The preferred content of transition metal is in a range of 1 to 50 at % based on the silicon atoms.

The preferred composition of the light-shielding film consists essentially of 10 at % to 95 at %, specifically 30 at % to 95 at % of silicon, 0 at % to 50 at %, specifically 0 at % to 30 at % of oxygen, 0 at % to 40 at %, specifically 0 at % to 20 at % of nitrogen, 0 at % to 20 at %, specifically 0 at % to 5 at % of carbon, and 0.5 at % to 35 at %, specifically 1 at % to 20 at % of transition metal. As mentioned above, the composition is selected such that the total content of oxygen and nitrogen may differ between the upper and lower layers.

The transition metal-containing silicon base material layers may be deposited by well-known techniques, for example, the sputtering techniques described in Patent Documents 1, 2 and 3. When oxygen and/or nitrogen is contained, the layers may be deposited by reactive sputtering. The total content of oxygen and nitrogen may be controlled by a proper choice of the type and amount of oxygen and/or nitrogen-containing reactive gas.

Another control method is by oxidative treatment of a surface-adjoining portion of the light-shielding film with ozone gas, oxygen plasma gas, ozone water, hydrogen peroxide water or the like, such that the treated portion may have a higher total content of oxygen and nitrogen than the remaining portion, the treated and remaining portions becoming the upper and lower layers, respectively. In this embodiment, a layer serving as the light-shielding film may be deposited in its entirety, after which oxidative treatment is effected.

The conditions of the oxygen-containing chlorine base dry etching used herein that ensure selective etching between upper and lower layers may be determined by the following procedure, for example.

First, on a transparent substrate used as a photomask substrate, typically a quartz substrate, a film of a transition metal-containing silicon base material is deposited to a predetermined thickness. On the film, dry etching with a chlorine base gas having a certain concentration of oxygen gas (or having a certain ratio of oxygen and chlorine gases) is effected in plural times while changing the concentration of oxygen gas (or changing the ratio of oxygen and chlorine gases). In each dry etching step, the etching clear time is determined, from which the etching rate relative to the amount of oxygen added is computed.

The etching clear time may be determined by measuring the reflectance of a film of transition metal-containing silicon base material being etched, as well as by visual observation if a film of silicon base material is observable during the etching step, or analysis of ions or elements in a plasma such as analysis of the emission spectrum of a plasma in the etching chamber. Rather than resorting to the etching clear time, the etching rate may also be determined by masking a portion of silicon base material film, etching for a certain time, and measuring the thickness of the etched away film using a probe type film thickness gauge, transmittance measurement or optical means such as ellipsometer, with these measurements being optionally combined.

Etch processing of the upper layer (which becomes a hard mask when the photomask blank is processed by the photomask manufacturing method) is carried out by fluorine base dry etching which is an etching step commonly used in processing of transition metal-containing silicon base materials. On the other hand, the lower layer is etched with oxygen-containing chlorine base dry etchant gas while using the upper layer as a hard mask. Of significant is a choice of etching conditions for the lower layer under which the transition metal-containing silicon base material is etched with oxygen-containing chlorine base dry etchant gas.

The oxygen-containing chlorine base dry etching used herein may be effected using chlorine gas ($Cl_2$) or the like, typically under ordinary dry etching conditions used in etching of chromium base material films of photomask blanks, while adjusting the amount of oxygen added (or adjusting the ratio of oxygen and chlorine gases).

Specifically, chlorine and oxygen gases are preferably combined so as to provide a molar ratio of oxygen/chlorine of from 0.001 to 1, more preferably from 0.003 to 0.5, and even more preferably from 0.005 to 0.3. More specifically, suitable etching conditions include a chlorine gas flow rate of 100 to 300 sccm, an oxygen gas flow rate of 0.1 to 100 sccm, and a gas pressure of 1 to 10 mTorr. Helium gas may be added at a flow rate of 1 to 20 sccm.

As long as the two contiguous silicon base material layers have a difference in the total content of oxygen and nitrogen in the film (the total content of oxygen and nitrogen in the lower layer is lower than the total content of oxygen and nitrogen in the upper layer), etching selectivity is available upon chlorine base dry etching under the above-specified conditions. As long as the difference ($C_1$-$C_2$) between the total content $C_1$ (mol %) of nitrogen and oxygen in the upper layer and the total content $C_2$ (mol %) of nitrogen and oxygen in the lower layer is preferably at least 5, more preferably at least 10, and even more preferably at least 20, the etching rate of the lower layer may be set faster than the etching rate of the upper layer, specifically by a factor of 10 or more by adjusting to an appropriate amount of oxygen added in accordance with the procedure described above. That is, a difference in etching rate sufficient for selectivity is obtained.

A photomask blank is processed by the following process until a photomask is manufactured.

First, a resist film is formed on the photomask blank. The resist film is exposed to a pattern of high-energy radiation such as electron beam and processed to form a resist pattern. The step of forming the resist pattern may use any desired method as long as the resist pattern has satisfactory resistance and a high resolution is available. According to the inventive method, etching is possible with a resist film having a thickness of up to 150 nm. Processing at a sufficiency accuracy is possible even with a resist film having a thickness of up to 100 nm. The thickness of the resist film is generally at least about 30 nm as the lower limit.

Next, a first stage etching step is carried out. Through this step, the resist pattern is transferred to the upper layer of transition metal-containing silicon base material having a higher total content of oxygen and nitrogen than the lower layer. This transfer uses fluorine base dry etching under such dry etching conditions as commonly employed in the etching of silicon base materials. It is dry etching with a fluorine-containing gas. Suitable fluorine-containing gases include gases containing fluorine, for example, fluorine gas, gases containing carbon and fluorine (e.g., $CF_4$ or $C_2F_6$), gases containing sulfur and fluorine (e.g., $SF_6$), the foregoing gases further containing hydrogen, and mixtures of a fluorine-free gas (e.g., helium) and a fluorine-containing gas. Another gas such as oxygen may be added thereto, if necessary.

Suitable etching conditions, preferably on use of oxygen-containing gas, include a ratio of oxygen gas to fluorine-containing gas (specifically a molar ratio of oxygen/fluorine) from 0.001 to 1000, and specifically a fluorine-containing gas flow rate of 1 to 1,000 sccm, preferably 10 to 100 sccm, an oxygen gas flow rate of 1 to 1,000 sccm, preferably 10 to 100 sccm, and a gas pressure of 1 to 20 mTorr. As compared with the etch mask in the form of a silicon oxide film as described in Patent Document 4, the processing by fluorine-containing dry etching provides for ease of etching when the silicon base material contains a transition metal, preferably molybdenum, attaining a great contribution to precise processing with a thin resist film.

In the first stage etching step, it is required that only the upper layer be completely etched away. An (upper) portion of the lower layer may also be etched away together with the upper layer. In the first stage etching step, the lower layer may be etched to such an extent that at least a portion of the lower layer disposed adjacent to the transparent substrate is left behind. That is, only the entirety of the upper layer or the entirety of the upper layer and a portion of the lower layer disposed remote from the transparent substrate may be removed. If a compositional transition intervenes between the upper and lower layers, etching is effected to such a depth that a portion providing for a substantial difference in the total content of oxygen and nitrogen as specified above is exposed.

Next comes a second stage etching step using as a mask the pattern of the upper layer resulting from the first stage etching step. In the second stage etching step, the remainder of the light-shielding film which has not been removed by the first stage etching step (the entirety or the remainder of the lower layer) is dry etched with oxygen-containing chlorine base dry etchant gas. Since a sufficient difference in etching rate is established between the upper and lower layers, the upper layer is little damaged even when the edge of the resist film is partially regressed by the etching. Pattern transfer is completed at a high accuracy. In this way, the light-shielding film is processed into the desired pattern.

EXAMPLE

Experiments and Examples are given below for further illustrating the invention although the invention is not limited thereto. The acronym RIE stands for reactive ion etching, ICP for inductively coupled plasma, and CW for continuous wave.

Experiment 1

Figure 3:
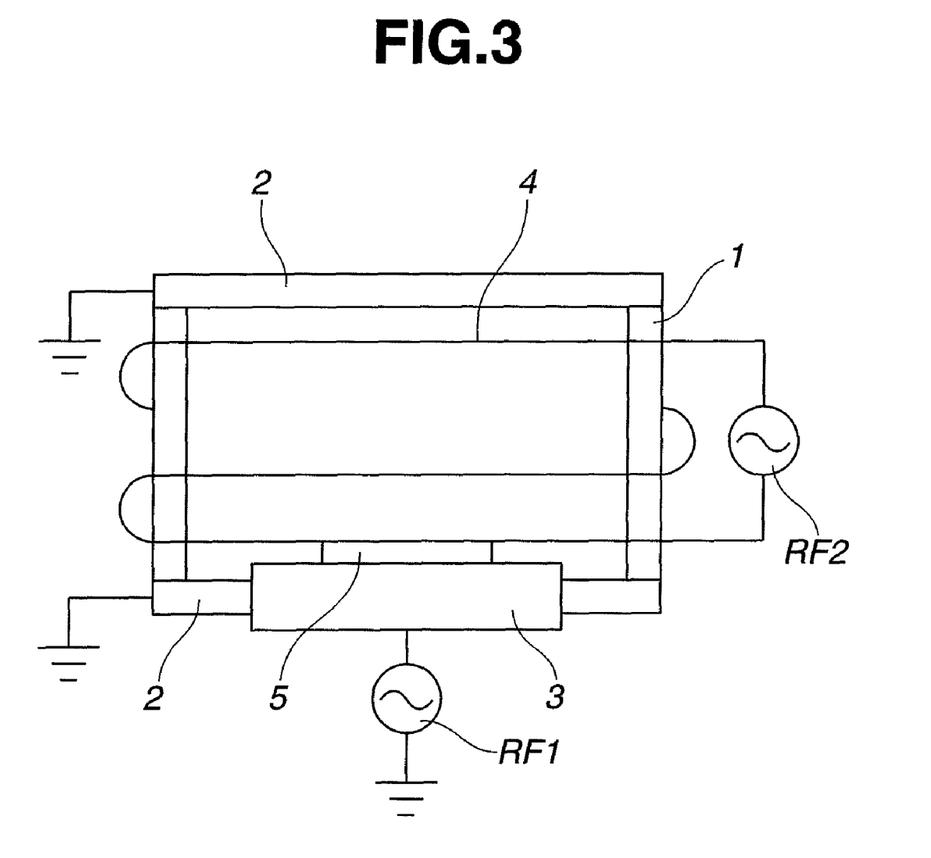
FIG. 3 schematically illustrates a dry etching system used in Experiments and Examples.

On a quartz substrate was deposited a silicon base material film of MoSiON (Mo:Si:O:N molar ratio=1:4:1:4 and total oxygen and nitrogen content=50 mol %) having a thickness of 75 nm. The film was subjected to chlorine dry etching. To evaluate an oxygen content in etchant gas and an etching rate under chlorine dry etching conditions, chlorine dry etching was carried out under the following conditions and at a flow rate of oxygen varying from 0 to 10.0 sccm. A reflectance of the film with respect to inspection light of 675 nm wavelength was measured over the etching time. The results are plotted in a diagram of FIG. 1. FIG. 3 shows an outline of an etching system used herein including a chamber 1, ground plates 2, a lower electrode 3, an antenna coil 4, a substrate to be treated 5, and radio frequency power sources RF1 and RF2.

Figure 1:
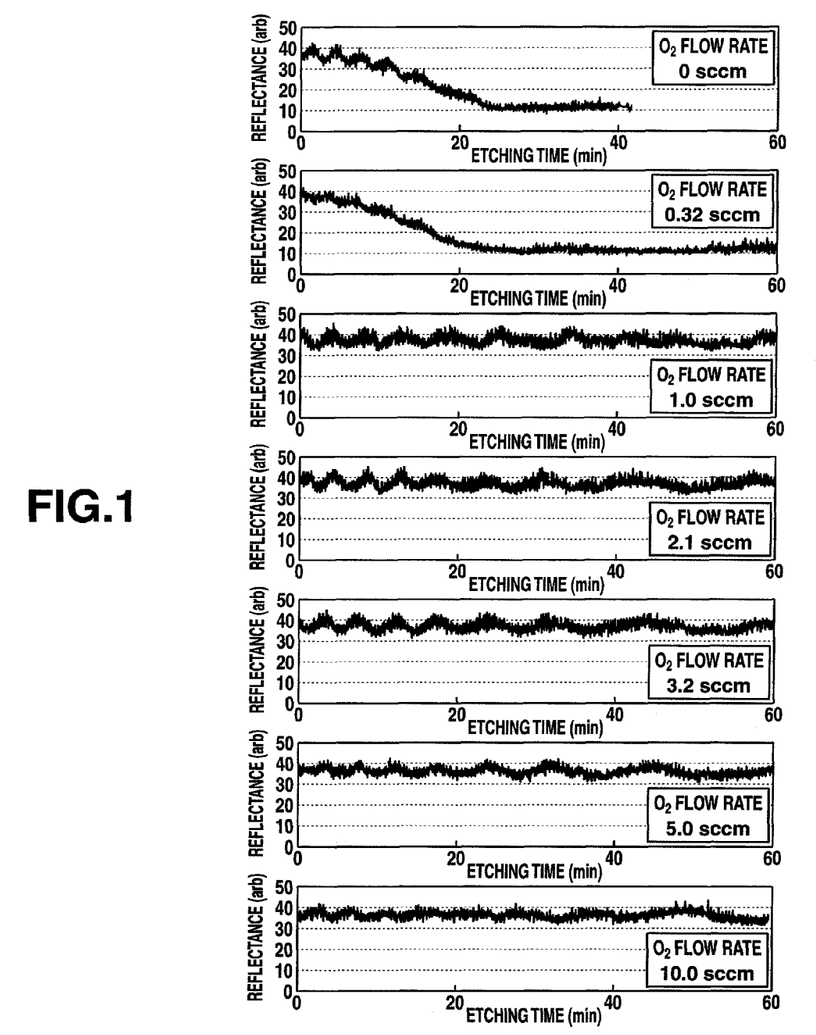
FIG. 1 is a diagram showing film reflectance versus etching time when films are etched at different $O_2$ flow rates in Experiment 1.

RF1 (RIE): pulse 700 V
RF2 (ICP): CW discharge 400 W
Pressure: 6 mTorr
$Cl_2$: 185 sccm
$O_2$: 0-10.0 sccm
He: 9.25 sccm FIG. 1 shows a change of reflectance with dry etching time, indicating that the reflectance on the film surface is about 40 prior to etching, declines in the course of etching, and reaches about 10 at the end of film etching. It is also seen that the MoSiON film having a total content of oxygen and nitrogen of 50 mol % is little etched when the oxygen flow rate in the dry etchant gas is at least 1 sccm (corresponding to an oxygen/chlorine molar ratio of at least 1/185).

Experiment 2

The film tested was a silicon base material film of MoSiN (Mo:Si:N molar ratio=1:3:1.5 and total oxygen and nitrogen content=27 mol %) having a thickness of 46 nm. As in Experiment 1, a change of reflectance with time was measured. The results are plotted in a diagram of FIG. 2.

Figure 2:
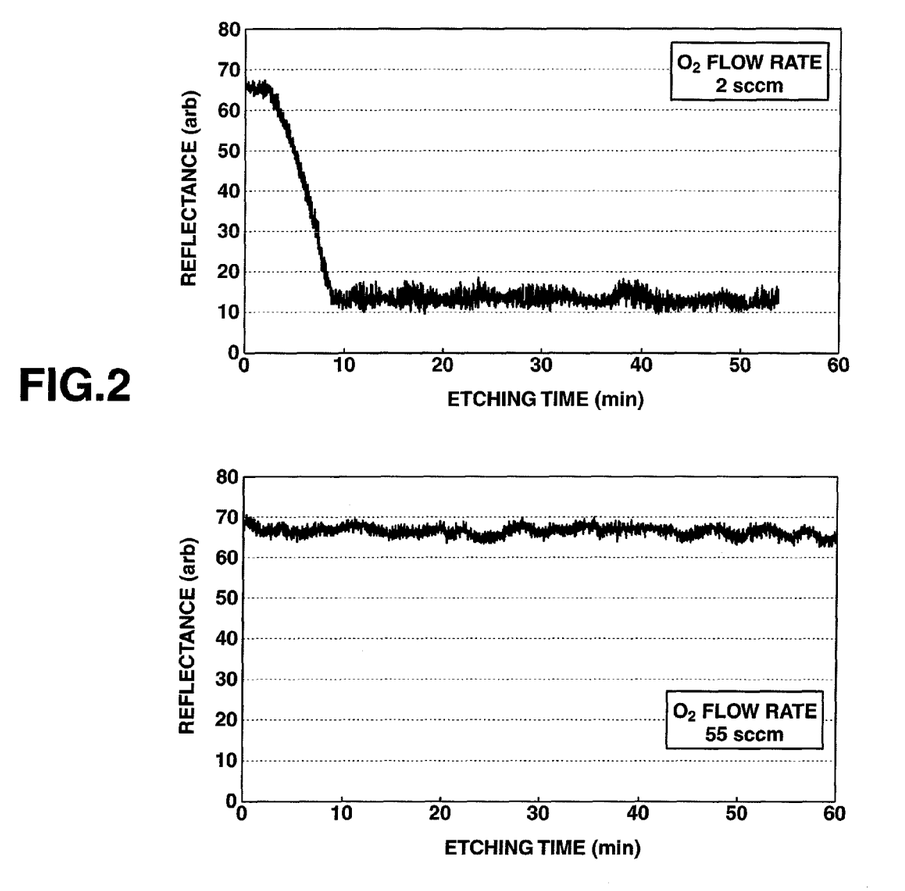
FIG. 2 is a diagram showing film reflectance versus etching time when films are etched at different $O_2$ flow rates in Experiment 2.

It is seen from FIG. 2 that when the oxygen flow rate is 2 sccm (corresponding to an oxygen/chlorine molar ratio of 2/185), the film is etched at a rate of about 5 nm/min. When the oxygen flow rate is 55 sccm (corresponding to an oxygen/chlorine molar ratio of 55/185), etching does not proceed at all.

Example 1

A photomask blank was prepared by depositing a lower layer of MoSiN (Mo:Si:N molar ratio=1:3:1.5) having a thickness of 50 nm on a quartz substrate and further depositing an upper layer of MoSiON (Mo:Si:O:N molar ratio=1:4:1:4) having a thickness of 10 nm thereon, to form a light-shielding film of the lower and upper layers. Using a spin coater, a chemically amplified resist composition adapted for EB lithography was coated on the photomask blank to form a resist film of 150 nm thick. The resist film was exposed to a pattern having a line width of 400 nm in an EB lithography system and developed to form a resist pattern for protecting a region of the light-shielding film to be retained.

Next, using the resist pattern as an etch mask, the light-shielding film was etched by a fluorine dry etching process under the following conditions (1). With this etching, the entirety of the upper layer was removed and a portion of the lower layer disposed contiguous to the upper layer was also removed.

Etching Conditions (1)
RF1 (RIE): CW 54 V
RF2 (ICP): CW 325 W
Pressure: 5 mTorr
$SF_6$: 18 sccm
$O_2$: 45 sccm
etching time: 10 sec Next, using the upper layer as a mask, the remainder of the lower layer was etched by a chlorine dry etching process under the following conditions (2).

Etching Conditions (2)
RF1 (RIE): pulse 700 V
RF2 (ICP): CW 400 W
Pressure: 6 mTorr
$Cl_2$: 185 sccm
$O_2$: 2 sccm
He: 9.25 sccm
etching time: 15 min By the successive etching steps under conditions (1) and (2), the light-shielding film was processed into the desired pattern at a high accuracy.

Japanese Patent Application No. 2009-140374 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a photomask from a photomask blank comprising a transparent substrate and a light-shielding film disposed thereon, the light-shielding film consisting of upper and lower layers made of transition metal-containing silicon base materials, at least the upper layer containing oxygen and/or nitrogen, the total content of oxygen and nitrogen in the upper layer being higher than that of the lower layer, the method comprising
a first stage etching step of dry etching the light-shielding film with fluorine base etchant gas using a resist pattern formed on the light-shielding film as an etch mask, for removing only the entirety of the upper layer or the entirety of the upper layer and a portion of the lower layer disposed remote from the transparent substrate such that at least a portion of the lower layer disposed adjacent to the transparent substrate is left behind, and
a second stage etching step of dry etching the light-shielding film with oxygen-containing chlorine base etchant gas for removing the remainder of the light-shielding film which has not been removed by the first stage etching step, thereby processing the light-shielding film into the desired pattern,
said photomask blank meets that provided that the material of the upper layer has a total content $C_1$ (mol %) of nitrogen and oxygen and the material of the lower layer has a total content $C_2$ (mol %) of nitrogen and oxygen, the difference between these total contents ($C_1$-$C_2$) is at least 5.

2. The method of claim 1 wherein the upper and lower layers have been deposited by sputtering while controlling a reactive gas during deposition such that the upper layer may have a higher total content of oxygen and nitrogen than the lower layer.

3. The method of claim 1 wherein the upper and lower layers have been formed by oxidative treatment of a surface-adjoining portion of the light-shielding film such that the treated portion may have a higher total content of oxygen and nitrogen than the remaining portion, the treated and remaining portions becoming the upper and lower layers, respectively.

4. The method of claim 1 wherein
the second stage etching step includes dry etching with oxygen-containing chlorine base etchant gas in a molar ratio of oxygen to chlorine between 0.001 and 1.

5. The method of claim 1 wherein the transition metal-containing silicon base material is a material containing a transition metal, silicon, and oxygen and/or nitrogen, or a material containing a transition metal and silicon and free of oxygen and nitrogen.

6. The method of claim 1 wherein the transition metal is at least one element selected from the group consisting of titanium, vanadium, cobalt, nickel, zirconium, niobium, molybdenum, hafnium, tantalum, and tungsten.

7. A method for manufacturing a photomask from a photomask blank comprising a transparent substrate and a light-shielding film disposed thereon, the light-shielding film consisting of upper and lower layers made of transition metal-containing silicon base materials, at least the upper layer containing oxygen and/or nitrogen, the total content of oxygen and nitrogen in the upper layer being higher than that of the lower layer, the method comprising
a first stage etching step of dry etching the light-shielding film with fluorine base etchant gas using a resist pattern formed on the light-shielding film as an etch mask, for removing the entirety of the upper layer and a portion of the lower layer disposed remote from the transparent substrate such that at least a portion of the lower layer disposed adjacent to the transparent substrate is left behind, and
a second stage etching step of dry etching the light-shielding film with oxygen-containing chlorine base etchant gas for removing the remainder of the light-shielding film which has not been removed by the first stage etching step, thereby processing the light-shielding film into the desired pattern.

8. The method of claim 7, wherein the upper and lower layers have been deposited by sputtering while controlling a reactive gas during deposition such that the upper layer may have a higher total content of oxygen and nitrogen than the lower layer.

9. The method of claim 7, wherein the upper and lower layers have been formed by oxidative treatment of a surface-adjoining portion of the light-shielding film such that the treated portion may have a higher total content of oxygen and nitrogen than the remaining portion, the treated and remaining portions becoming the upper and lower layers, respectively.

10. The method of claim 7, wherein
said photomask blank meets that provided that the material of the upper layer has a total content $C_1$ (mol %) of nitrogen and oxygen and the material of the lower layer has a total content $C_2$ (mol %) of nitrogen and oxygen, the difference between these total contents ($C_1$-$C_2$) is at least 5.

11. The method of claim 7, wherein
the second stage etching step includes dry etching with oxygen-containing chlorine base etchant gas in a molar ratio of oxygen to chlorine between 0.001 and 1.

12. The method of claim 7, wherein the transition metal-containing silicon base material is a material containing a transition metal, silicon, and oxygen and/or nitrogen, or a material containing a transition metal and silicon and free of oxygen and nitrogen.

13. The method of claim 7, wherein the transition metal is at least one element selected from the group consisting of titanium, vanadium, cobalt, nickel, zirconium, niobium, molybdenum, hafnium, tantalum, and tungsten.

14. A method for manufacturing a photomask from a photomask blank comprising a transparent substrate and a light-shielding film disposed thereon, the light-shielding film consisting of upper and lower layers made of molybdenum-containing silicon base materials, at least the upper layer containing oxygen and/or nitrogen, the total content of oxygen and nitrogen in the upper layer being higher than that of the lower layer, the method comprising
a first stage etching step of dry etching the light-shielding film with fluorine base etchant gas using a resist pattern formed on the light-shielding film as an etch mask, for removing only the entirety of the upper layer or the entirety of the upper layer and a portion of the lower layer disposed remote from the transparent substrate such that at least a portion of the lower layer disposed adjacent to the transparent substrate is left behind, and
a second stage etching step of dry etching the light-shielding film with oxygen-containing chlorine base etchant gas for removing the remainder of the light-shielding film which has not been removed by the first stage etching step, thereby processing the light-shielding film into the desired pattern.

15. The method of claim 14, wherein the upper and lower layers have been deposited by sputtering while controlling a reactive gas during deposition such that the upper layer may have a higher total content of oxygen and nitrogen than the lower layer.

16. The method of claim 14, wherein the upper and lower layers have been formed by oxidative treatment of a surface-adjoining portion of the light-shielding film such that the treated portion may have a higher total content of oxygen and nitrogen than the remaining portion, the treated and remaining portions becoming the upper and lower layers, respectively.

17. The method of claim 14, wherein
said photomask blank meets that provided that the materials of the upper layer has a total content $C_1$ (mol %) of nitrogen and oxygen and the material of the lower layer has a total content $C_2$ (mol %) of nitrogen and oxygen, the difference between these total contents ($C_1$-$C_2$) is at least 5.

18. The method of claim 14, wherein
the second stage etching step includes dry etching with oxygen-containing chlorine base etchant gas in a molar ratio of oxygen to chlorine between 0.001 and 1.

19. The method of claim 14, wherein the molybdenum-containing silicon base material is a material containing molybdenum, silicon, and oxygen and/or nitrogen, or a material containing molybdenum and silicon and free of oxygen and nitrogen.

* * * * *